United States Patent [19]

Rajsuman

[11] Patent Number: 5,377,148
[45] Date of Patent: Dec. 27, 1994

[54] APPARATUS AND METHOD TO TEST RANDOM ACCESS MEMORIES FOR A PLURALITY OF POSSIBLE TYPES OF FAULTS

[75] Inventor: Rochit Rajsuman, Richmond Heights, Ohio

[73] Assignee: Case Western Reserve University, Cleveland, Ohio

[21] Appl. No.: 620,359

[22] Filed: Nov. 29, 1990

[51] Int. Cl.⁵ .............................................. G11C 7/00
[52] U.S. Cl. ............................ 365/201; 365/230.03; 371/21.2; 371/25.1
[58] Field of Search .......................... 365/201, 230.03; 371/21.2, 25.1

[56] References Cited

U.S. PATENT DOCUMENTS

| | | | |
|---|---|---|---|
| 4,369,511 | 1/1983 | Kimura et al. | 371/21.2 |
| 4,414,665 | 11/1983 | Kimura et al. | 371/21.2 |
| 4,541,090 | 9/1985 | Shiragasawa | 371/21.2 |
| 4,715,034 | 12/1987 | Jacobson | 371/21.2 |
| 4,833,677 | 5/1989 | Jarwala | 371/21.1 |
| 4,868,789 | 8/1989 | MacDonald | 365/200 |

(List continued on next page.)

OTHER PUBLICATIONS

"Efficient Algorithms for Testing Semiconductor Random Access Memories", R. Nair, S. M. Thatte and J. A. Abraham, IEEE Trans. Comp., vol. 27(6), pp. 572–576, Jun. 1978.

"Comments on an Optimal Algorithm for Testing Stuck-at Faults in Random Access Memories", R. Nair, IEEE Trans. Comp., vol. 28(3), pp. 258–261, Mar. 1979.

"A Realistic Fault Model and Test Algorithm for Static Random Access Memories" R. Dekker, F. Beenker and L. Thijssen, IEEE Trans. CAD, vol. 9(6), pp. 567–572, Jun. 1990.

"Fault Modeling and Test Algorithm Development for Static Random Access Memories", R. Dekker, F. Beenker and L. Thijssen, Proc. Int. Test Conf., pp. 343–352, 1988.

"Linear Sum Codes for Random Access Memories", T. Fuja, C. Heegard and R. Goodman, IEEE Trans. Comp., vol. 37(9), pp. 1030–1042, Sep. 1988.

"Fault Propagation Through Embedded Multiport Memories", J. Savir, W. H. McAnney and S. R. Vecchio, IEEE Trans. Comp., vol. 36(5), pp. 592–602, May 1987.

(List continued on next page.)

*Primary Examiner*—Eugene R. LaRoche
*Assistant Examiner*—Christopher R. Glembocki
*Attorney, Agent, or Firm*—Fay, Sharpe, Beall, Fagan, Minnich & McKee

[57] ABSTRACT

The present invention provides a test method of the complexity of 7n to test RAM devices, where n is the number of bits. This method tests all cell stuck-at-1/0 faults, state transition 1-to-0 and 0-to-1 faults, state coupling faults between two cells and data retention faults in random access memories. A standardized testable design memory (STD architecture) is presented which keeps the time required to test a RAM constant irrespective of the memory size. The design is shown through four examples to cover both bit and byte oriented memories. The memory address decoder is implemented in two or more levels. The decoder decoding the most significant addressed is modified by addition of an external control signal line. Memory of the RAM (memory cell array) is partitioned into blocks. The size of these blocks is defined by the last level (least significant address) of the memory address decoder. The design is highly structured and requires a very small amount of extra hardware. The architecture is not only applicable at chip level, but also at the board level. A slight modification allows fault diagnosis to be achieved in the STD architecture. This architecture also permits disconnection of faulty memory blocks and use the good part as ¾ or ½ of the original capacity. Such reconfiguration in STD architecture can be done by specifying a fixed voltage (Gnd or Vdd) at the input of the most significant decoder. Such a reconfiguration does not require special hardware.

15 Claims, 15 Drawing Sheets

U.S. PATENT DOCUMENTS

| | | | |
|---|---|---|---|
| 4,958,345 | 9/1990 | Fujisaki | 371/25.1 |
| 4,958,346 | 9/1990 | Fujisaki | 371/25.1 |
| 4,974,226 | 11/1990 | Fujimori et al. | 371/25.1 |
| 5,107,501 | 4/1992 | Zorian | 371/21.3 |
| 5,173,906 | 12/1992 | Dreibelbis et al. | 371/22.5 |

OTHER PUBLICATIONS

"Detection of Pattern Sensitive Faults in Random Access Memories", J. P. Hayes, IEEE Trans. Comp., vol. 24(2), pp. 150–157, Feb. 1975.

"Testing Memories for Single Cell Pattern Sensitive Faults", J. P. Hayes, IEEE Trans. Comp., vol. 29(3), pp. 249–254, Mar. 1980.

"Parallel Testing for Pattern Sensitive Faults in Semiconductor Random Access Memories", P. Mazumder and J. K. Patel, IEEE Trans. Comp., vol. 38(3), pp. 394–407, Mar. 1989.

"A Reconfigurable Parallel Signature Analyzer for Concurrent Error Correction in Dram", P. Mazumder, J. H. Patel and J. A. Abraham, IEEE J. Solid State Circuits, vol. 25(3), pp. 866–870, Jun. 1990.

"A New Parallel Test Approach for Large Memories", T. Sridhar, IEEE Design and Test, pp. 15–22, Aug. 1986.

"Built-in Self Testing of Embedded Memories", S. K. Jain and C. E. Stroud, IEEE Design and Test, pp. 27–37, Oct. 1986.

"Built-in Test for RAMs", P. H. Bardell and W. H. McAnney, IEEE Design and Test, pp. 29–36, Aug. 1988.

"TRAM: A Design Methodology for High Performance, Easily Testable, Multimegabit RAMs", N. T. Jarwala and D. K. Pradhan, IEEE Trans. Comp., vol. 37(10), pp. 1235–1250, Oct. 1988.

"A 1-Mbit CMOS Dynamic RAM With Design for Test Functions", H. McAdams, J. H. Neal, B. Holland, S. Inoue, W. K. Loh and K. Poteet, IEEE J. Solid State Circuits, vol. 21(5), pp. 635–641, Oct. 1986.

"A 60-ns 4-Mbit CMOS DRAM With Built-in Self Test Function", T. Oshsawa, T. Furuyama, Y. Watanabe, H. Tanaka, N. Kushiyama, K. Tsuchida, Y. Nagahama, S. Yamano, T. Tanaka, S. Shinozaki and K. Natori, IEEE J. Solid State Circuits, vol. 22(5), Oct. 1987.

"A 14-ns 245x1 CMOS SRAM With Multiple Test Modes", P. H. Voss, L. C. M. G. Pfennings, C. G. Phelan, C. M. O'Connell, T. H. Davies, H. Ontrop, S. A. Bell and R. H. W. Salters, IEEE J. Solid State Circuits, vol. 24(4), pp. 874–880, Aug. 1989.

"A New Array Architecture for Parallel Testing in VLSI Memories", Y. Matsuda, K. Arimoto, M. Tsukude, T. Oishi and K. Fujishima, Proc. Int. Test Conf. pp. 322–326, 1989.

"Diagnosis and Repair of Memory With Coupling Faults", M. F. Chang, W. K. Fuchs and J. H. Patel, IEEE Trans. Comp., vol. 38(4), pp. 493–500, Apr. 1989.

"New Approaches for the Repairs of Memories With Redundancy by Row/Column Deletion for Yield Enhancement", W. K. Huang, Y. Shen and F. Lombardi, IEEE Trans. CAD, vol. 9(3), pp. 323–328, Mar. 1990.

"On the Repair of Redundant RAMs", IEEE Trans. CAD, vol. 6(2), pp. 222–231, Mar. 1987.

"Row/Column Replacement for the Control of Hard Defects in Semiconductor RAMs", T. Fuja and C. Heegard, IEEE Trans. Comp., vol. 35(11), pp. 996–1000, Nov. 1986.

```
/* Total address space is n bits
/* Test Start
   For i = 1 to n Do
      write '0' in cell (i)
      read cell (i)              /* test for s-a-1
   End /* Wait state defects retention of '0'.
   PAUSE                         /* typical time 100 msec.

/* Cycle One
   While i = 1 to (n/2); j = n to (n/2 + 1) Do
      write '1' in cell (i)
      read cell (i)              /* test for s-a-0 and 0 --> 1
      write '1' in cell (j)
      read cell (j)              /* test for s-a-0 and 0 --> 1
      increment i
      decrement j
   Continue
/* Wait state detects retention of '1'.
   PAUSE                         /* typical time 100 msec.

/* Cycle Two
   For i = 1 to n Do
      read cell (i)
   End

/* Cycle Three
   While i = (n/2) to 1; j = (n/2 + 1) to n Do
      write '0' in cell (i)
      read cell (i)              /* test for 1 --> 0
      write '0' in cell (j)
      read cell (j)              /* test for 1 --> 0
      decrement i
      increment j
   Continue
   End
```

FIGURE 1a

```
/* Total address space is n bits
/* Test Start
   For i = 1 to n Do
     write '1' in cell (i)
     read cell (i)              /* test for s-a-0
   End /* Wait state detects retention of '1'.
   PAUSE                        /* typical time 100 msec.

/* Cycle One
   While i = 1 to (n/2); j = n to (n/2 + 1) Do
     write '0' in cell (i)
     read cell (i)              /* test for s-a-1 and 0 --> 1
     write '1' in cell (j)
     read cell (j)              /* test for s-a-1 and 0 --> 1
     increment i
     decrement j
   Continue
/* Wait state detects retention of '1'.
   PAUSE                        /* typical time 100 msec.

/* Cycle Two
   For i = 1 to n Do
     read cell (i)
   End

/* Cycle Three
   While i = (n/2) to 1: j = (n/2 + 1) to n Do
     write '0' in cell (i)
     read cell (i)              /* test for 1 --> 0
     write '0' in cell (j)
     read cell (j)              /* test for 1 --> 0
     decrement i
     increment j
   Continue
     End
```

FIGURE 1b

```
/* Total address space is n bits
/* Initialization Phase
   For i = 1 to n Do
      write '0' in cell (i)
   End /* Test Start
/* Wait state detects retention of '0'.
   PAUSE                          /* typical time 100 msec.

/* Cycle One
   While i = 1 to n; j = n to 1 Do
      read cell (i)               /* test for s-a-1 (if i=<n/2)
                                  /* test for s-a-0 and 0 --> 1
                                     (if i > /* n/2)

complement cell (i)
      read cell (j)               /* test for s-a-1 (if j >=n/2
                                     + 1)
                                  /* test for s-a-0 and 0 --> 1
                                     (if j =< /* n/2)

complement cell (j)
      increment i
      decrement j
   Continue
/* Wait state detects retention of '1'.
   PAUSE                          /* typical time 100 msec.

/* Cycle Two
   For i = 1 to n Do
      read cell (i)               /* test for 1 --> 0 transition
   End
```

FIGURE 2a

```
/* Total address space is n bits
/* Initialization Phase
   For i = 1 to n Do
      write '0' in cell (i)
   End /* Test Start
/* Wait state detects retention of '0'.
   PAUSE                        /* typical time 100 msec.

/* Cycle One
   While i = 1 to n Do
      read cell (i)             /* test for s-a-1
      complement cell (i)
      increment i
   Continue /* Wait state detects retention of '1'.
   PAUSE                        /* typical time 100 msec.

Repeat Cycle One             /* test for s-a-0 and 0 --> 1

/* Cycle Two
   For i = 1 to n Do
      read cell (i)             /* test for 1 --> 0 transition
   End
```

FIGURE 2b

```
/* Total address space is n bits
/* Initialization Phase
   For i = 1 to n Do
      write '0' in cell (i)
   End /* Test Start
/* Wait state detects retention of '0'.
   PAUSE                          /* typical time 100 msec.

/* Cycle One
   While i = 1 to (n/2); j = n to (n/2 + 1) Do
      read cell (i)               /* test for s-a-1
      complement cell (i)
      read cell (j)               /* test for s-a-1
      complement cell (j)
      increment i
      decrement j
   Continue
/* Wait state detects retention of '1'.
   PAUSE                          /* typical time 100 msec.

/* Cycle Two
   While i = 1 to (n/2); j = n to (n/2 + 1) Do
      read cell (i)               /* test for s-a-0 and 0 --> 1
      complement cell (i)
      read cell (j)               /* test for s-a-0 and 0 --> 1
      complement cell (j)
      increment i
      decrement j
   Continue /* Cycle Three
   For i = 1 to n Do
      read cell (i)               /* test for 1 --> 0 transition
   End
```

FIGURE 2c

```
/* Total address space is n bits
/* Initialization Phase
   For i = 1 to n Do
      write '0' in cell (i)
   End /* Test Start
/* Wait state detects retention of '0'.
   PAUSE                          /* typical time 100 msec.

/* Cycle One
   While i = 1 to (n/2); j = n to (n/2 + 1) Do
      read cell (i)               /* test for s-a-1
      complement cell (i)
      read cell (j)               /* test for s-a-1
      complement cell (j)...
      increment i
      decrement j
   Continue
/* Wait state detects retention of '1'.
   PAUSE                          /* typical time 100 msec.

/* Cycle Two
   While i = 1 to n; j = n to 1 Do
      read cell (i)               /* test for s-a-0 and 0 --> 1
                                  /* (if i =< n/2)
                                  /* test for 1 --> 0 (if i >
                                  n/2)
      complement cell (i)
      read cell (j)               /* test for s-a-0 and 0 --> 1
                                  /* (if j >= n/2 + 1)
                                  /* test for 1 --> 0 (if j =<
                                  n/2)
      complement cell (j)
      increment i
      decrement j
   Continue
   End
```

FIGURE 2d

APPARATUS AND METHOD TO TEST RANDOM ACCESS MEMORIES FOR A PLURALITY OF POSSIBLE TYPES OF FAULTS

BACKGROUND OF THE INVENTION

The present invention relates to the art of random access memories. It finds particular application in connection the testing of large scale memories and will be described with particular reference thereto. It is to be appreciated, however, that the invention will also find uses in other applications of electronic memories.

A significant amount of work has been done in the recent years to obtain fast and very large memory systems. As a result, the density of semiconductor memory chips has increased dramatically. The increase in density and size of the memories has resulted in a corresponding increase in the difficulty of testing of such memories. A multi-mega bit random access memory (RAM) requires extended amounts of time in order to test cell stuck-at faults and other varieties of possible faults. To overcome this problem, two general approaches have been developed. First, researchers have attempted to develop efficient test generation methods, and second, memories including built-in self-testing capabilities have been proposed.

Several innovative test methods for random access memories have been reported. These methods can be categorized into two classes. One set of methods are based on a stuck-at fault model. Representative examples of proposed methods based on this model include, J. Knaizuk and C. R. P. Hartman, "An optimal method for testing stuck-at faults in ransom access memories", IEEE Trans. Comp., vol. 26(11), pp. 1141-1144, November 1977; R. Nair, S. M. Thatte and J. A. Abraham, "Efficient methods for testing semiconductor random access memories", IEEE Trans. Comp., vol. 27(6), pp. 572-576, June 1978; R. Nair, "Comments on an optimal method for testing stuck-at faults in random access memories", IEEE Trans. Comp., vol. 28(3), pp. 258-261, March 1979; R. Dekker, F. Beenker and L. Thijssen, "A realistic fault model and test method for static random access memories", IEEE Trans. CAD, vol. 9(6), pp. 567-572, June 1990; R. Dekker, F. Beenker and L. Thijssen, "Fault modeling and test method development for static random access memories", Proc. Int. Pest Conf., pp. 343-352, 1988; A. Birolini, W. Buchel and D. Heavner, "Test and screening strategies for large memories", Proc. European Test Conf., pp. 276-283, 1989; T. Fuja, C. Heegard and R. Goodman, "Linear sum codes for random access memories", IEEE Trans. Comp., vol 37(9), pp. 1030-1042, September 1988; C. A. Papachristou and N. B. Sahgal, "An improved method for detecting functional faults in semiconductor random access memories", IEEE Trans. Comp., vol. 34(2), pp. 110-116, February 1975; J. Savir, W. H. McAnney and S. R. Vecchio, "Fault propagation through embedded multiport memories", IEEE Trans. Comp., vol. 36(5), pp. 592-602, May 1987; R. David, A. Fuentes and B. Courtois, "Random pattern testing versus deterministic testing of RAMs", IEEE Trans. Comp., vol. 38(5), pp. 637-650, May 1989.

The second class of test methods are based on a pattern sensitive neighborhood cell fault model. Representative examples of these types of methods include, J. P. Hayes, "Detection of pattern sensitive faults in random access memories", IEEE Trans. Comp., vol. 24(2), pp. 150-157, February 1975; J. P. Hayes, "Testing memories for single cell pattern sensitive faults", IEEE Trans. Comp., vol 29(3), pp. 249-254, March 1980; D. S. Suk and S. M. Reddy, "A march test for functional faults in semiconductor random access memories", IEEE Trails. Comp., vol. 30(12), pp. 982-985, December 1981; S. C. Seth and K. Narayanaswamy, "A graph model for pattern sensitive faults in random access memories", IEEE Trans. Comp., vol 30(12), pp. 973-977, December 1981; P. D. Jong and A. V. D. Goor, "Test pattern generation for API faults in RAM", IEEE Trans. Comp., vol. 37(11), pp. 1426-1428, November 1988; P. Mazumder and J. K. Patel, "Parallel testing for pattern sensitive faults in semiconductor random access memories", IEEE Trans. Comp., vol. 38(3), pp. 394-407, March 1989.

The best known methods from both categories are polynomial in time. As the density of memories is quadrupling in every 2-3 years, even a linear increase in test time becomes undesirable for large memories.

To overcome the problem of excessively large test time, built-in self-test (BIST) devices and methods have been developed. These BIST methods can also be categorized into two classes. One set uses extra hardware for on chip test generation and response evaluation (using a parallel signature analyzer). Examples of this category of testing can be found in P. Mazumder, J. H. Patel and J. A. Abraham, "A reconfigurable parallel signature analyzer for concurrent error correction in DRAM", IEEE J. Solid State Circuits, vol. 25(3), pp. 866-870, June 1990; T. Sridhar, "A new parallel test approach for large memories", IEEE Design and Test, pp. 15-22, August 1986; S. K. Jain and C. E. Stroud, "Built-in self testing of embedded memories", IEEE Design and Test, pp. 27-37, October 1986; K. Kinoshita and K. K. Saluja, "Built-in testing of memory using an on-chip compact testing scheme", IEEE Trans. Comp., vol. 35(10), pp. 862-870, October 1986; M. Franklin, K. K. Saluja and K. Kinoshita, "A built-in self-test method for row-column pattern sensitive faults in RAMs", IEEE J. Solid State Circuits, vol. 25(2), pp. 514-523, April 1990.

This class of testing is based on the pattern sensitive neighborhood cell fault model as discussed, for example, in the above Hayes reference.

The second category of testing uses extra hardware to partition the entire memory into small blocks in order to test the blocks in parallel (using external test generation). Examples representative of this form of testing can be found in R. Kraus, O. Kowarik, K. Hoffmann and D. Oberle, "Design for test of Mbit DRAMs", Proc. Int. Test Conf., pp. 316-321, 1989; P. H. Bardell and W. H. McAnney, "Built-in test for RAMs" IEEE Design and Test, pp. 29-36, August 1988; N. T. Jarwala and D. K. Pradhan, "TRAM: A design methodology for high performance, easily testable, multimegabit RAMs", IEEE Trans. Comp., vol. 37(10), pp. 1235-1250, October 1988; H. McAdams, J. H. Neal, B. Hollard, S. Inoue, W. K. Lob and K. Poteet, "A 1-Mbit CMOS dynamic RAM with design for test functions", IEEE J. Solid State Circuits, vol. 21(5), pp. 635-641, October 1986; P. Mazumder, "Parallel testing of parametric faults in a three dimensional dynamic random access memory", IEEE J. Solid State Circuit, vol. 23(4), pp. 933-941, August 1988; T. Oshsawa, T. Furuyama, Y. Watanabe, H. Tanaka, N. Kushiyama, K. Tsuchida, Y. Nagahama, S. Yamano, T. Tanaka, S. Shinozaki and K. Natori, "A 60-ns 4-Mbit CMOS DRAM with built-in self test function", IEEE J. Solid State Circuits, vol. 22(5), October 1987; P. H. Voss, L. C. M. G. Pfennings, C. G. Phelan, C. M. O'Connell, T. H. Davies, H. Ontrop, S. A. Bell and R. H. W. Salters, "A 14-ns 256K×1 CMOS SRAM with multiple test modes", IEEE J. Solid State Circuits, vol. 24(4), pp. 874–880, August 1989; Y. Matsuda, K. Arimoto, M. Tsukude, T. Oishi and K. Fujishima, "A new array architecture for parallel testing in VLSI memories", Proc. Int. Test Conf., pp. 322–326, 1989.

This class of testing is based upon the cell stuck-at fault model described in the Nair-Thatte-Abraham references previously discussed. The previously mentioned paper, "TRAM: A design methodology for high performance, easily testable, multimegabit RAM's" discloses that use of partitioning methods results in a significant savings the test time required for large memories. The major disadvantage of such partitioning methods is the requirement of large additional hardware overhead. In that paper, it is noted that if a 1M-bit memory is partitioned into 16 blocks (64K-bit modules) using an H-tree, the percentage increase in area due to the additional hardware is approximately 30% of the chip. The hardware overhead decreases the manufacturing yield significantly as well as causes performance degradation.

The general method to test a memory system is to assume a fault model and generate input vectors to cover the faults.

Probably, the most widely used fault model for RAM devices is the stuck-at model as described in the Nair-Thatte-Abraham reference. In the Nair-Thatte-Abraham reference, the entire circuit is divided into three blocks, i.e., memory cell array, decoder circuit and the sense amplifier or read/write circuit. It was considered there that in the memory array, a cell may have stuck-at-1/0 fault or a cell may have a coupling fault with other cells. Any failure in the decoder circuit will result in the address cell not being accessed, a nonaddressed cell being accessed, or in multiple cells being accessed. Read/write circuits may have stuck-at-1/0 faults which appear as memory cell stuck-at faults.

Physical fault mechanisms in memory devices have been investigated as shown for example in the above mentioned Dekker-Beenker-Thijssen article. It was found that all the faults in memory can be covered by the fault model given in Nair-Thatte-Abraham, with the addition of state transition faults and data retention faults. A more general fault model will thus include the following faults:

1. Memory cell stuck-at-1/0 fault;
2. Memory cell state transition 1-to-0 and 0-to-1 fault;
3. Memory cell bridging with other cell (state coupling);
4. Stuck-at, multiple access or wrong addressing faults in decoder; and,
5. Data retention fault.

For simplicity, the present discussion is restricted to the above mentioned faults. Also, in this discussion, a single fault assumption has been made. If necessary, one can further extend this fault model by considering transistor stuck-open/stuck-on faults. However, in that case appropriate changes in the test generation method will be required. A simplified fault model may also be used if desired. Any test generation method can be used so long as the test vectors cover all faults under the assumed fault model.

SUMMARY OF THE INVENTION

A general advantage of the invention is to provide a random access memory (RAM) which is testable in a constant time period regardless of the size of the memory. This is accomplished by partitioning the memory array into a plurality of individually accessible equivalently sized memory blocks. Each of the individual memory blocks are designed to have a memory capacity less than the total memory capacity of the RAM. A decoding scheme is provided which consists of at least two levels. One of the levels is used to decode the least significant address lines (this level lies within the memory blocks) and the other level is used to decode the most significant address lines (this level lies outside the memory blocks).

In the embodiment of the modified memory array, a control signal is incorporated into the decoder associated with the most significant address lines. When in the test mode, the control signal simultaneously selects all of the plurality of individual memory blocks in a parallel fashion. The selected memory blocks are then each tested in parallel for the existence of any previously determined fault condition types and the presence of what is determined to be a fault at the output.

BRIEF DESCRIPTION OF THE DRAWINGS

FIG. 1a is a method written in pseudo code, using 7 n read/write operations to generate test vectors for random access memories to test all possible faults of the memories;

FIG. 1b is an equivalent alternative method to that shown in FIG. 1a, also having 7 n read/write operations;

FIGS. 2a–c are methods used to generate test vectors for random access memories, the methods having 6 n read/write operations, they do not cover all state coupling faults;

FIG. 2d is a method used to generate test vectors (missing!) for random access memories, using 7 n read/write operations, all state coupling faults are not covered;

DETAILED DESCRIPTION OF THE PREFERRED EMBODIMENT

Figure 3:
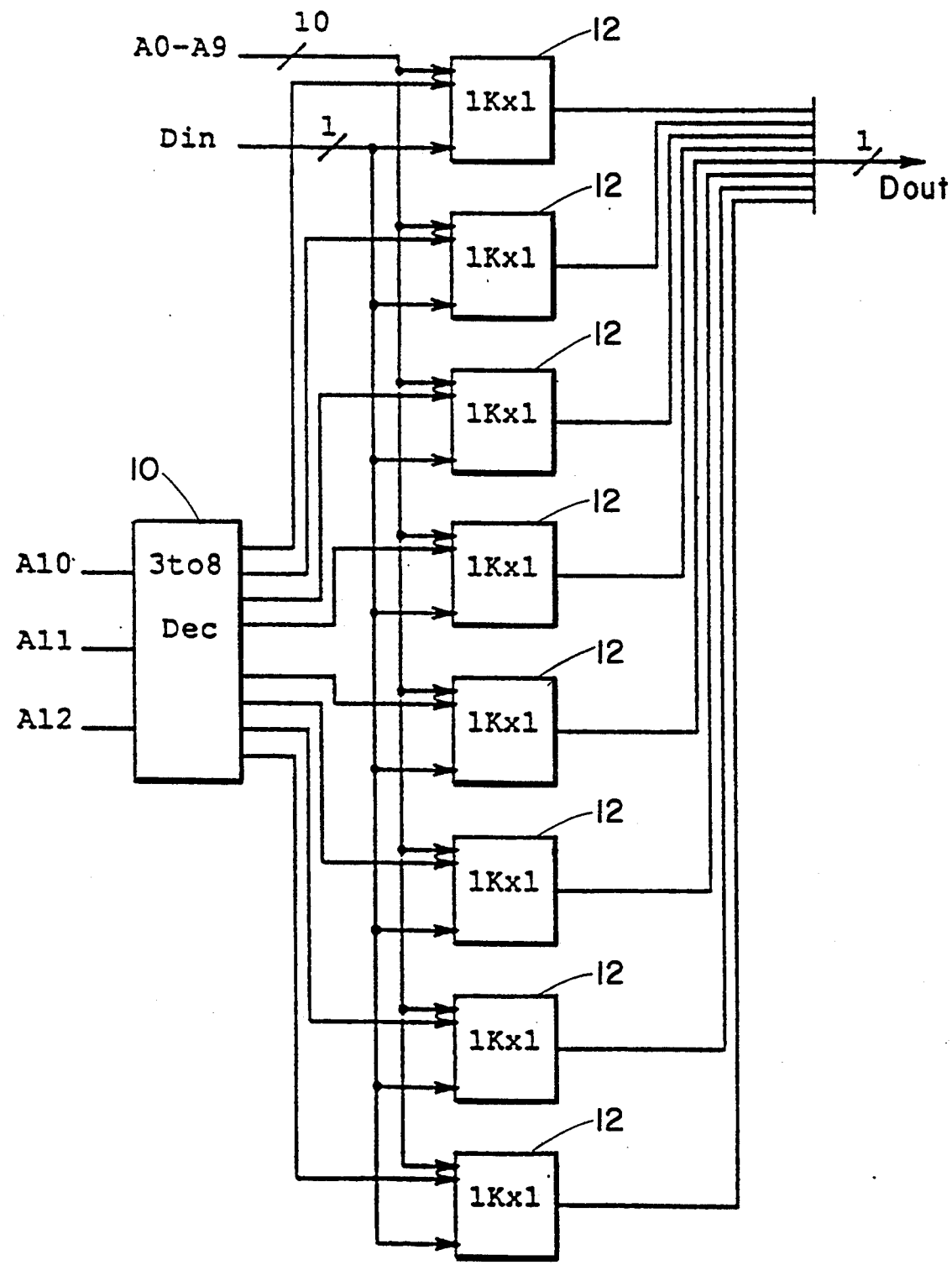
FIG. 3 is a design of 8K×1 memory using 1K×1 blocks.

New test methods to test random access memories (RAM's) will first be presented. The first two new methods require only 7 n read/write operations where n is the number of memory array bits to be tested. These methods cover all cell stuck-at-1/0 faults, 1-to-0 and 0-to-1 state transition faults, bridging faults between two cells (state coupling), data retention faults and decoder faults.

Two versions of the new methods are given in FIGS. 1a and 1b as pseudo code. In the method of FIG. 1a, first the initialize cycle (initiate) sets the entire memory to '0'. During the first cycle (cycle one), one cell is read at a time and the cell value is complemented (write '1'). Two memory cell pointer loops are initiated simultaneously, one addresses from the first cell (1) to the (n/2)th cell and the other from the last cell (n) to the (n/2+1)th cell. During this first cycle, from the first cell (1) to the (n/2)th cell and the last cell (n) to the (n/2+1)th cell, the appropriate output which is read is '1'. Hence, all cell stuck-at-0 faults are detected. Also during the first cycle, all cell 0-to-1 transition failure faults are tested. During the third cycle (cycle three), the memory being tested is again exercised using two simultaneous pointer cycles. One loop sweeps from the (n/2+1)th cell to the last cell and the other loop sweeps from the (n/2)th cell to the first cell. During these loops, the appropriate output read is '0'.

As each cell is tested for stuck-at-0 faults (cycle one) after the detection of stuck-at-1 fault (initialization phase), state transition 0-to-1 faults are also detected (first reading '0', then reading '1'). At the end of the first cycle (cycle one), every cell contains '1' again. To test 1-to-0 transitions, it is necessary to do so during the third cycle (cycle three). Wait states are used in between initialization and the first cycle (test data retention '0') and between first cycle and second cycle (test data retention '1'). It should be noticed that this procedure also covers all possible states (00, 01, 10 and 11) for any two arbitrary cells. Therefore, any bridging or state coupling faults between two cells are also detected.

The functionality of the method of FIG. 1b is the same as the method of 1a. A notable difference is that in the method 1a, the memory is initialized to '0', while in method 1b the memory is initialized to '1'.

If a simplified fault mode is used, the memory testing methods can be made faster. For example, if all cell state coupling faults are not considered, memory can be tested in 6 n read/write operations. Three versions of such simplified or parsed methods are given in FIGS. 2a–c and a fourth using 7 n read/write operations is shown in FIG. 2d. Other versions of these methods can also be obtained if the memory is initialized to '1' instead of '0'. As in FIG. 1, wait states are used between initialization and the first cycle, and between the first and second cycle to detect data retention faults.

It should be noted that these methods are not restricted to STD architecture (described below). Any random access memory (SRAM as well as DRAM) can be tested with these methods. For STD architecture, a byte oriented test method is not required (m-bit word size memory is divided into m blocks of 1-bit memory). However, the test method can be easily extended to byte oriented memory by using K different data background, where $K = \log_2 m$, as shown by Dekker-Beenker-Thijssen.

Turning now to the standardized testable design memory (STD architecture), the basic concept of this architecture is to divide the whole memory into a plurality of smaller blocks and to test the smaller blocks in parallel. This partitioning is implemented during the design phase itself. The main concept is to partition the memory address decoder into two or more levels and design the memory cell array accordingly. This partitioning method eliminates the large hardware overhead required in other partitioning procedures. The only requirement is to use a modified decoder for the most significant address lines to ensure testability. As demonstrated below, this modification in the decoder allows the testing of large amounts of memory without causing a significant increase in hardware overhead.

A difference between the method and apparatus at hand and that of previous apparatuses and methods is that previously, partitioning had been done using extra hardware (making an H-tree as in Jarwala and Pradhan) after the layout design of the memory cell array itself. The access to the partitioned block is obtained by extra hardware. Due to the overhead associated with the partitioning of the circuit, the number of partitions was required to be kept to a small number. Thus, this arrangement becomes impractical as the memory is divided into progressively smaller blocks.

In the STD architecture, hardware is not required to partition the memory cell array. Thus, any size of block partition can be used. In fact, a small block is desirable because it reduces the test time required.

The following four examples illustrate differing embodiments which implement the present STD architecture. These examples are selected to cover both 1-bit and m-bit word size memories. To express the memory size, the notation n×m has been adopted, where n represents the number of words and m represents the word size. For example, 16K×1 represents 16K-bits and 16K×8 represents 16K-bytes.

As a first example, consideration is given to an embodiment for the design of a 8K×1 memory as shown in FIG. 3. Overall, this memory requires a 13-to-8K decoder. This overall decoder can be implemented in two levels, first using a 10-to-1K decoder (associated with each 1K×1 block) and a 3-to-8 decoder 10. Thus, the memory can be designed by eight blocks of 1K-bits 12 (each associated with the 10-to-1K decoder) and the 3-to-8 decoder 10. This architecture is applicable at the chip as well as board level. At board level, each block of 1K-bits represents one chip of 1K×1 RAM which also contains a 10-to-1K decoder.

Figure 4:
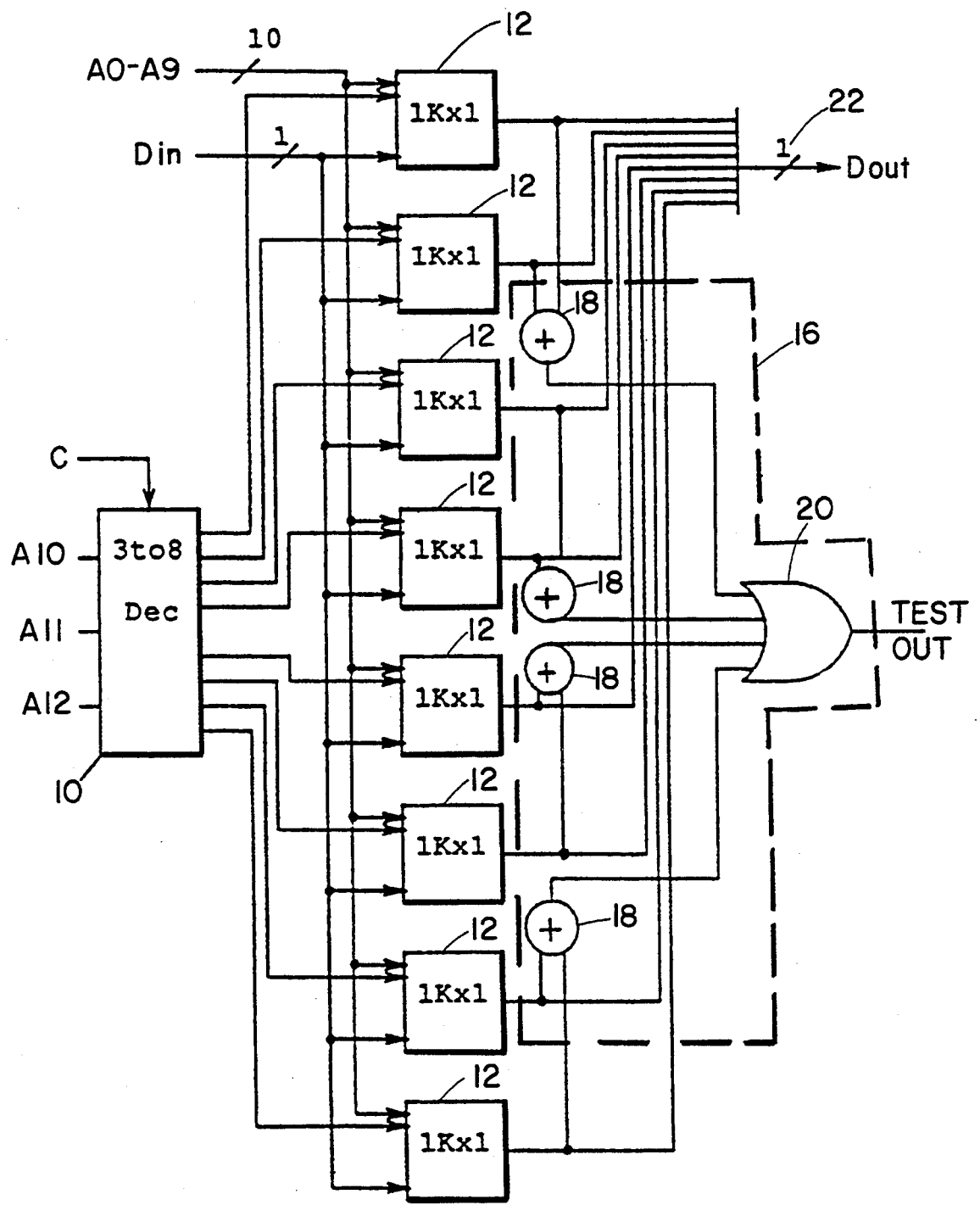
FIG. 4 is a testable design of 8K×1 memory corresponding to a first embodiment of the present invention.
Figure 5A:
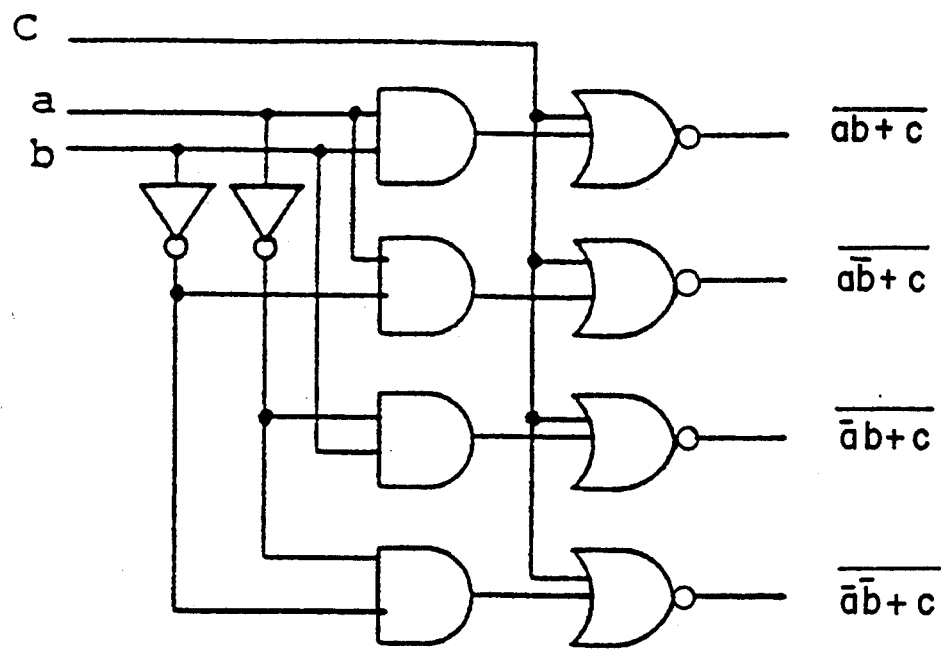
FIG. 5a is a 2-to-4 decoder, the outputs being NOR gates in an active low arrangement with external control signal C.
Figure 5B:
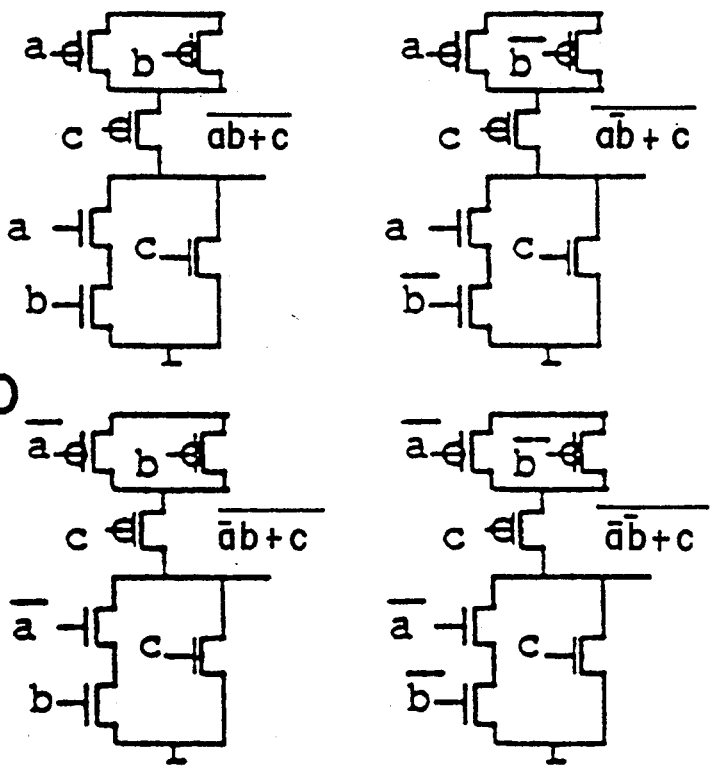
FIG. 5b is a transistor level circuit of the 2-to-4 decoder of FIG. 5a with the external control signal C.

The design is made testable, as shown in FIG. 4, by modifying the 3-to-8 decoder 10, which contains the most significant address lines A10–A12. The modification is done by adding an extra control signal C to the decoder. The modified decoder design at the gate level is shown in FIG. 5a. The decoder uses active low NOR gates for its output. An equivalent decoder design at the transistor level is shown in FIG. 5b. Additionally, with continuing reference to FIG. 4, a parity tree 16 is added at the outputs of 1K-bit blocks 12 consisting of four (4)

exclusive OR gates 18 and one OR gate 20. The extra control signal C to the 3-to-8 decoder 10 allows the selection of all of its output lines when control signal C is at a logic '1'. This is done during the test mode. When the control signal C is at a logic '0', the decoder is in the normal mode such that only one of its outputs is selected. It should be noted that, a 8-bit register can be used instead of the parity tree 16 at the output lines of 1K-bit memory blocks 12.

To test this memory, control signal C is held at a logic '1'. Thus, the same data read/write operations can be accomplished in a parallel manner to all eight memory blocks using address lines A0–A9. During this mode, all eight blocks are tested in parallel by using one of the methods discussed in connection with FIG. 1a–b and 2a–d. In case of a fault in any block, the output of the parity tree 16 is a logic '1' and thereby, a fault is detected. Using one of the given methods, all eight blocks are tested by 7 n or 6 n read/write operations.

After the testing of the memory blocks, the control signal C is switched to a logic '0' converting the 3-to-8 decoder 10 into normal mode. Under the above configuration, eight input combinations are needed to test the 3-to-8 decoder. It should be noted that if 1K×1 blocks are tested by the method disclosed in FIG. 1a, all cells contain '0' after the conclusion of the test. Hence, for each combination of A10–A12, decoder faults are detectable by writing a logic '1' in the cell and reading it. However, to test the next combination, the cell should be set at a logic '0'. Thus, 24 read/write operations are required (last write is not necessary, thus, 23 operations are sufficient). For three address lines A10–A12, eight possible combinations ($2^3 = 8$) are available.

These eight possible combinations are applied at the address lines A10–A12, while keeping A0–A9 to a fixed level (preferable, all 0s or all 1s). The response is observed at $D_{out}$ 22. For each combination of A10–A12, a "1" is written in a cell of one block and then that corresponding cell in each block is read. Therefore, the required read/write operations to test the decoder are $8 \times (1 \text{ write} + 8 \text{ read}) = 72$. Thus, the whole 8 k-bit memory is tested in a test time necessary to test 1K-bit memory. In this situation, (7K+72) read/write operations are necessary to provide an accurate test. The hardware overhead in this design is one control signal c, 4 XOR gates 18 and 1 OR gate 20. The control signal line C is limited to the 3to-8 decoder 10 and does not extend to the memory blocks. Therefore, the routing area is negligible for the control signal line C. The 10-to-1K decoders (not shown) within the memory blocks can also be implemented in a two or multi-level manner. However, these 10 to 1K decoders need no modification because the partition size selected for this example is 1K-bits. The implementation of a 13-to-8K decoder into two levels does not cause any increase in overhead. In fact, as will be shown below, it reduces the transistor count. If desired, 7 XOR gates can be used to check the test output instead of 4 XOR and 1 OR gate.

Figure 6:
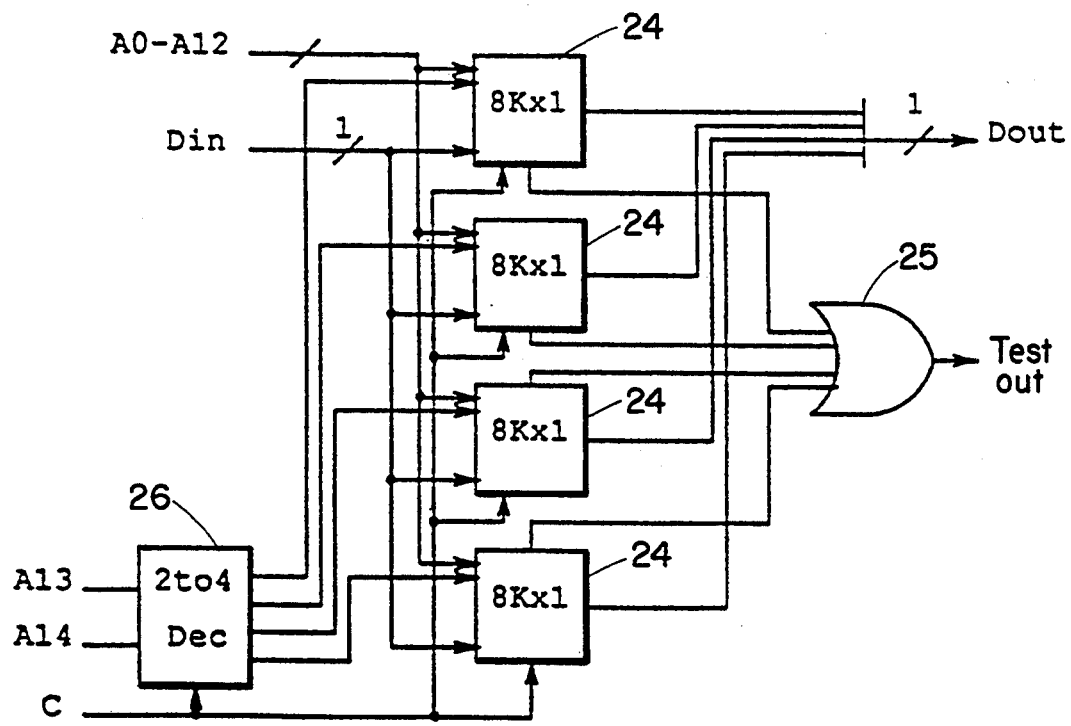
FIG. 6 is a testable design of 32K×1 memory corresponding to a second embodiment of the present invention, with each 8K×1 block being equivalent to the circuit of FIG. 4.

Consideration will now be given to an embodiment for a design of a 32K-bits memory. This memory, as shown in FIG. 6, can be designed with four blocks of 8K-bit memories 24 as used in the first example and with an additional 2-to-4 decoder 26. Each 8K×1 block 24 shown corresponds with the entire scheme diagrammed in FIG. 4. This 2-to-4 decoder 26 contains the most significant address lines and hence, it is modified by adding an extra control signal C. The same control signal can be used in the 2-to-4 decoder 26, which is used in the 3-to-8 decoder 10 of FIG. 4. During the test mode, the four 8K×1 blocks are selected using the control signal C (C=1) and all eight 1K×1 blocks are selected for each 8K×1 block. Therefore, by setting C=1, all 32 blocks of 1K×1 memory are selected. These 32 blocks are tested in parallel by 7 n read/write operations using address lines A0–A9.

After the testing of the memory blocks, the control signal C is switched to a logic '0'. Under this condition, the 2-to-4 decoder 26 and four 3-to-8 decoders (included within the 8K×1 blocks), are tested by 32 (4×8) combinations (128 read/write operations). Hence, again the whole 32K-bit memory is tested as 1K-bit memory using (7K+128) vectors. It should be noted that if the control signals to 2-to-4 decoder 26 and 3-to-8 decoders are different, then all four 3-to-8 decoders can also be tested in parallel. In that case, the total number of required test vectors is only (7K+92).

The hardware required in this design is four parity trees (16 of FIG. 4, each having 4 XOR gates and 1 OR gate), another OR gate 25 and a control signal C. The extra hardware due to the routing of the control signal C is again negligible. Effectively, hardware overhead in this embodiment is 16 XOR gates and 5 OR gates.

The above two examples were restricted to bit oriented memory. Since the data line in such memories are one bit long, and observation is difficult, a parity circuit is used in FIGS. 4 and 6 to compress the test output. When the word size is m-bits long, m data lines are more easily observable. Therefore, it becomes easy to divide the whole memory into m blocks and test them in parallel. The design of such a memory is discussed in the following third embodiment.

Figure 7:
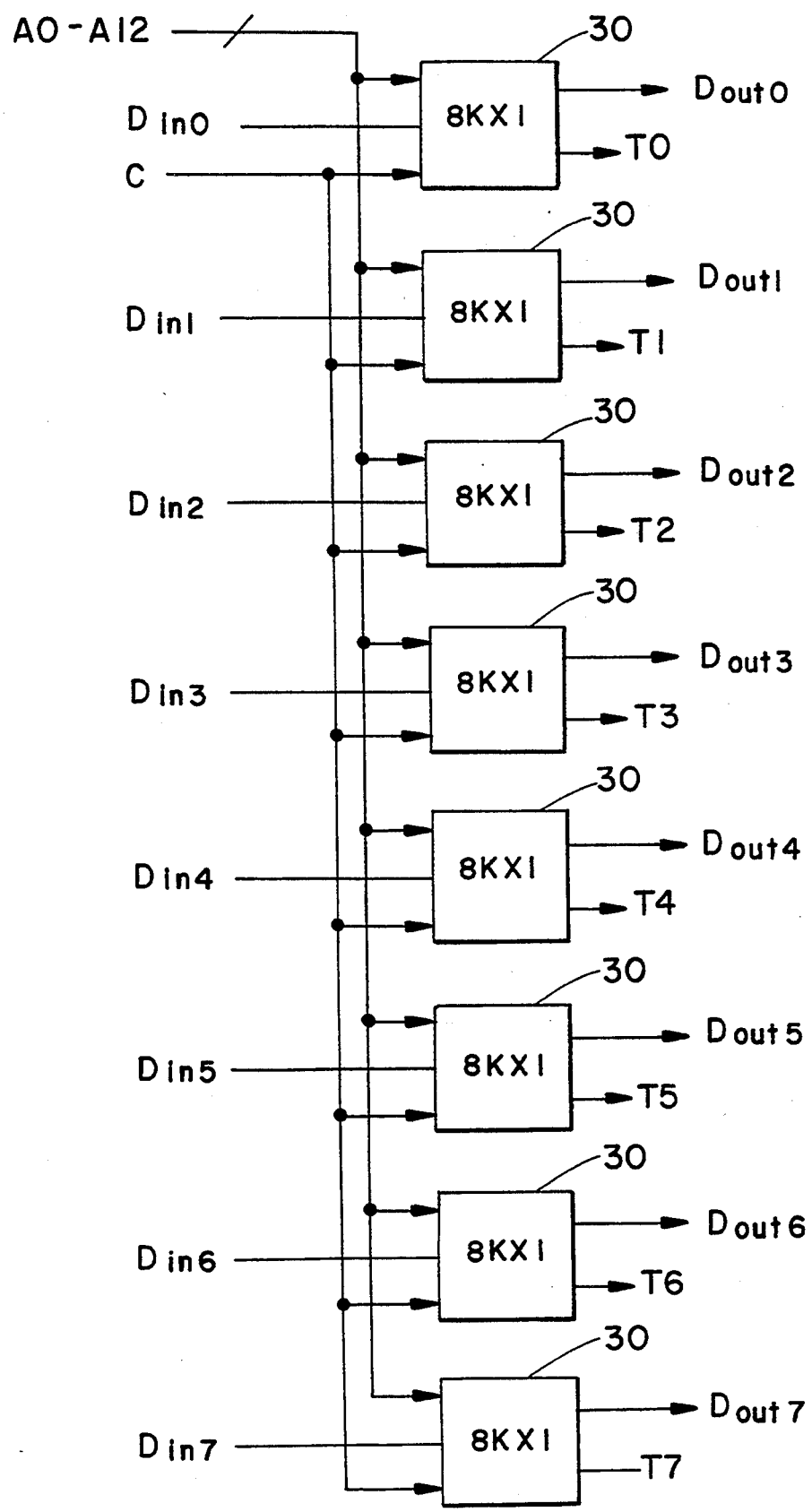
FIG. 7 is a testable design of 8K×8 memory corresponding to a third embodiment of the present invention, with each 8K×1 block being equivalent to the circuit of FIG. 4.

Consideration will now be given to the design of an embodiment for a 8K×8 (8K-bytes) memory as shown in FIG. 7. An 8K×8 memory can be designed by using eight blocks of 8K×1 memory 30. In FIG. 7, each block of 8K×1 memory is equivalent to the circuit given in FIG. 4.

All eight blocks of 8K×1 memory, 30 are tested in parallel by making $D_{in0} = D_{in1} = \ldots = D_{in7}$. Effectively, the testing procedure is the same as the first example. The number of memory operations is (7K+72). As each test output is separately observable, any fault can be detected and the faulty block can be uniquely identified. After the testing of the memory blocks, eight additional write and read operations (16 operations) are used to test the coupling among $D_{in}$ lines and among $D_{out}$ lines. This is achieved by keeping one $D_{in}$ line equal to '1' while all others are set to '0', for a fixed value of A0–A12. Thus, the whole 8K×8 memory is tested by (7K+98) vectors.

The hardware overhead in this case is eight parity trees (16 of FIG. 5) each having 4 XOR gates and 1 OR gate (total 32 XOR gates and 8 OR gates), and one control signal. It should be noted that modification of the test methods to exercise byte oriented memory is not desirable. The amount of hardware overhead will remain the same, however, the number of test vectors will increase to (21K+72). If someone uses only XOR gates (no OR gates) then the overhead will be 56 XOR gates and one control signal.

A final embodiment illustrates a case where the number of words is increased for a memory of a word size of m-bits. Such memory can be designed either by the method shown in the second embodiment, or by the method shown in the third embodiment. Both cases have been considered in the following fourth embodiment.

Figure 8A:
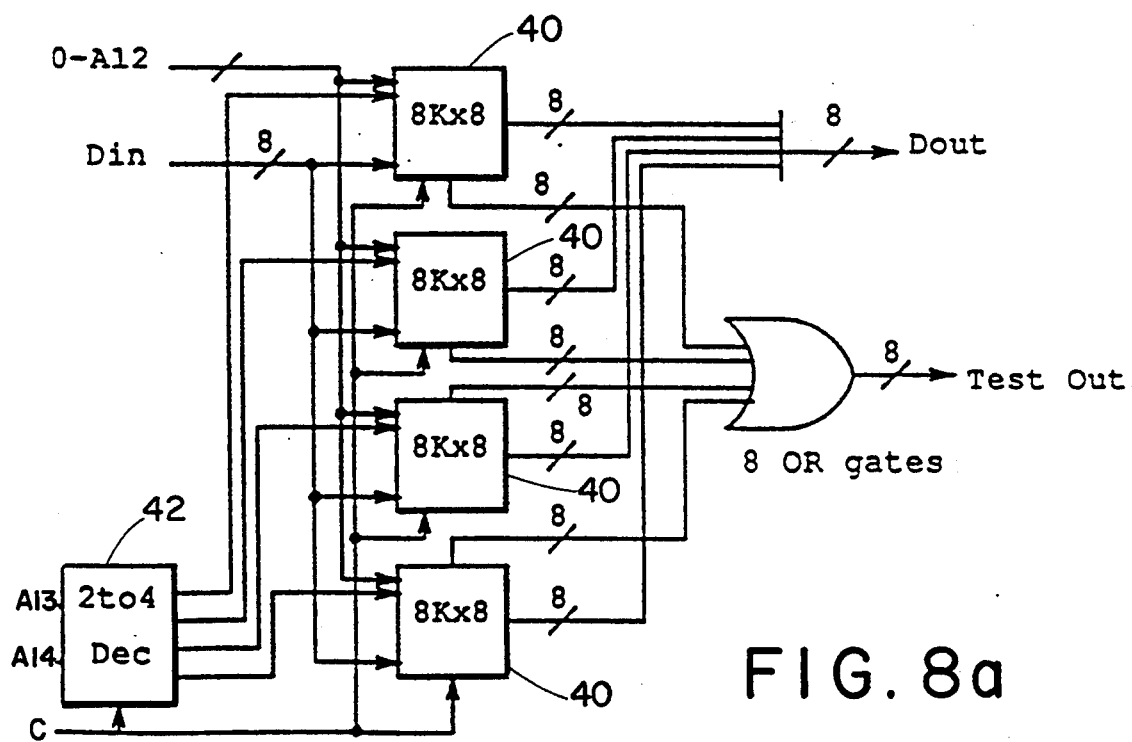
FIG. 8a is a testable design of an 32K×8 memory array using the concept of the second embodiment with each 8K×8 block being equivalent to the circuit of FIG. 7.

Consideration of the design of a 32K×8 memory will now be made. This memory can be designed by using four blocks of 8K×8 memory 40 and a 2-to-4 decoder 42, as shown in FIG. 8a. The concept is similar to the second embodiment. In FIG. 8a, each block of 8K×8 memory 40 is equivalent to FIG. 7. As the additional 2-to-4 decoder 42 contains the most significant address lines, it is modified by adding a control signal C. If a control signal, separate from that used in 8K×8 blocks is implemented, the memory can be tested by (7K+98+20) vectors or read/write operations. The hardware overhead in this case is two control signals and 128 XOR and 40 OR gates, (4*(32 XOR+8 OR)+8 OR).

Figure 8B:
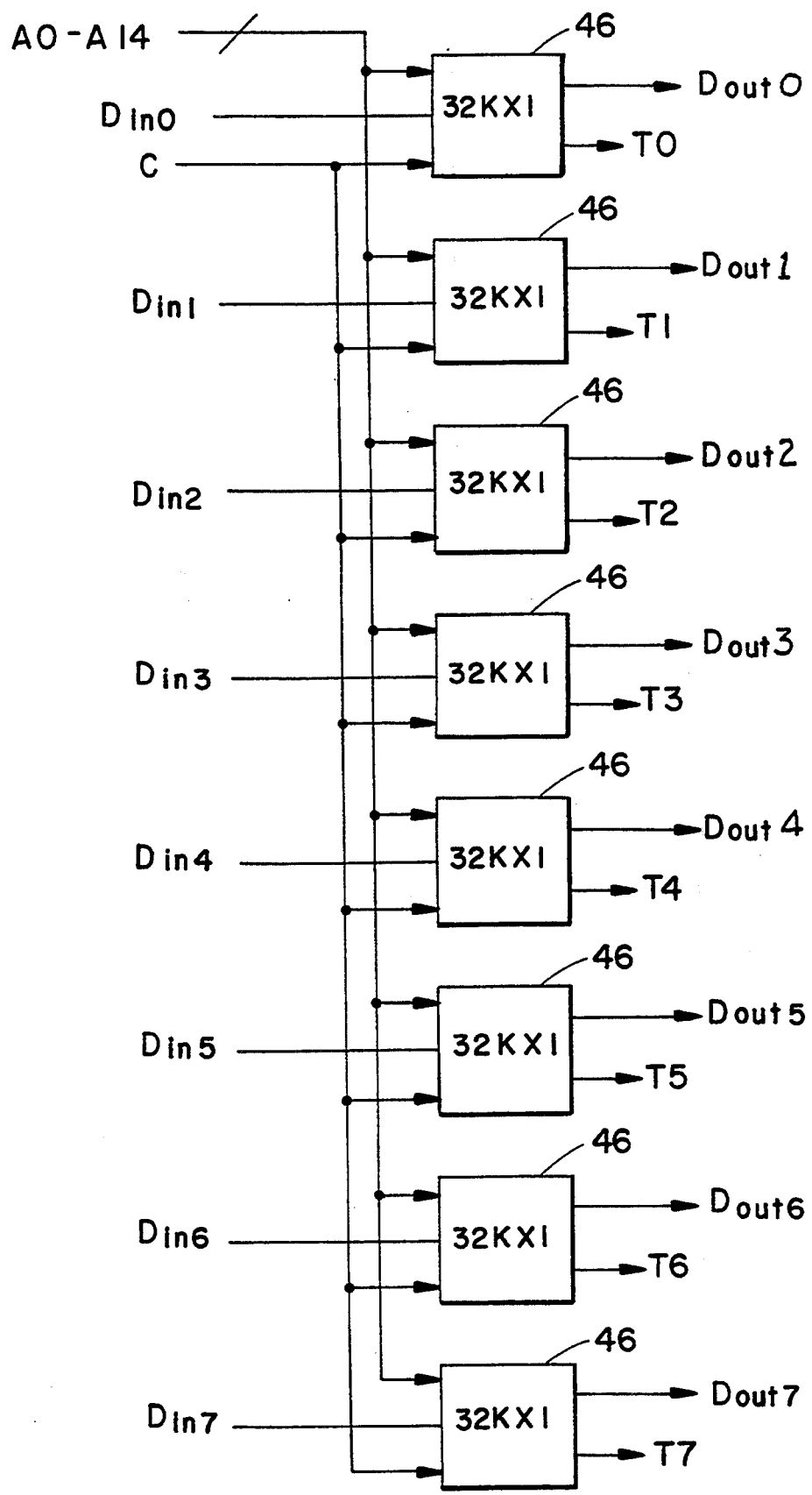
FIG. 8b is a testable design of an 32K×8 memory array using the concept of the third embodiment with each 32K×1 block being equivalent to the circuit of FIG. 6.

Another possibility is to design this memory by using eight blocks of 32K×1 memory 46 as shown in FIG. 8b. The concept is similar to the third embodiment. In FIG. 8b, each block of 32K×1 memory 46 is equivalent to FIG. 6. In this case, the whole memory can be tested by (7K+128+20) vectors. The hardware overhead is one control signal and 80 XOR and 40 OR gates, (8*(16 XOR+5 OR)).

Figure 9:
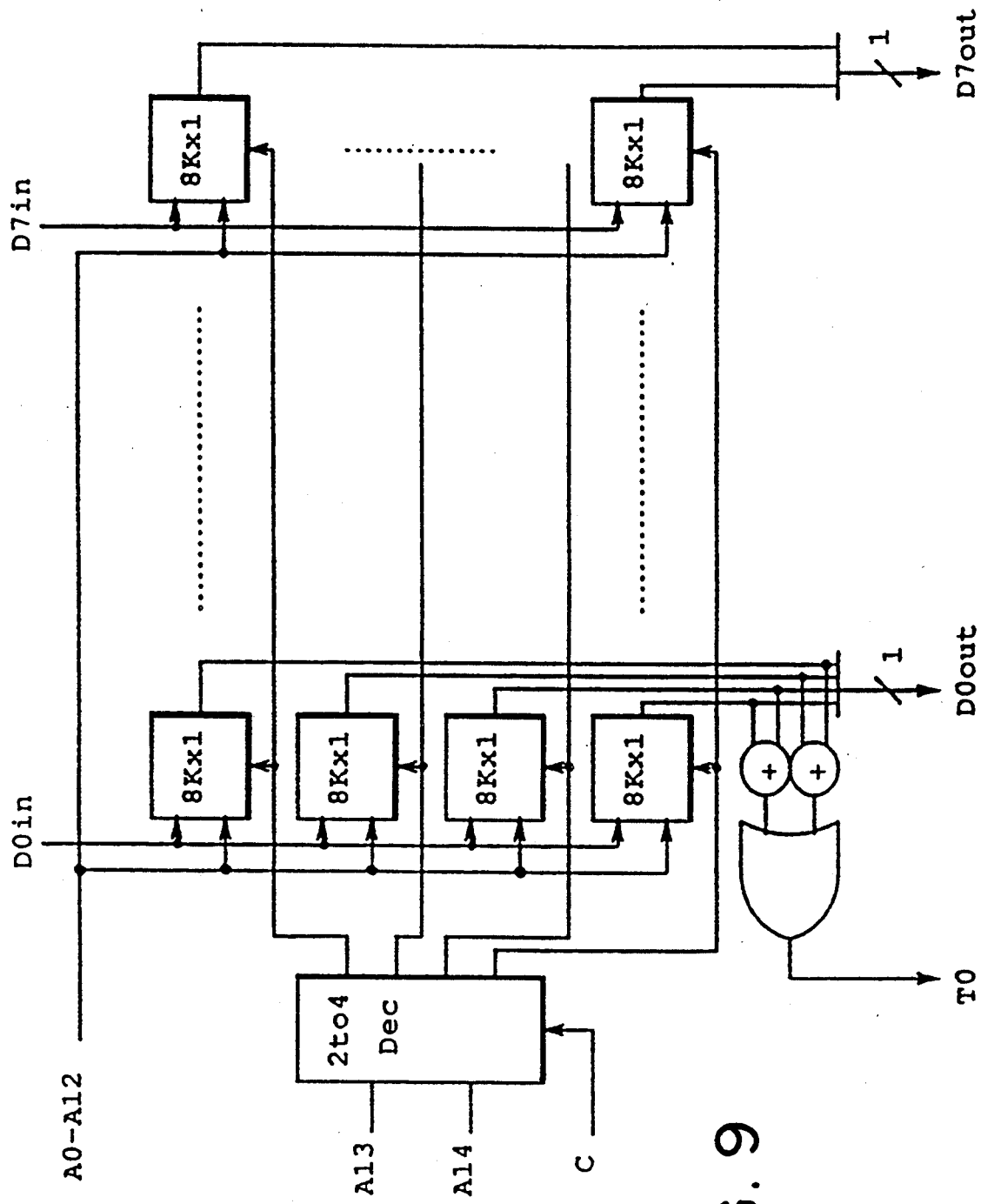
FIG. 9 is a testable design of an 32K×8 memory array when the partition size of the memory blocks are 8K×1.

In both approaches, the hardware overhead and test time is comparable. The amount of hardware overhead can be reduced significantly by using larger blocks of memory arrays instead of 1K×1 arrays. However, in that case memory test time will increase. For example, if 8K×1 memory blocks are used, the whole memory can be tested by (56K+20) vectors, while only (16 XOR+8 OR) gates (or 24 XOR gates) are required, as can be seen in FIG. 9. It should be noted that equivalently, 256K×1 memory can be designed using four additional 3-to-8 decoders, and can be tested by 24 gates in (56K+98) read/write operations.

The above four examples show that various size and word length memories can be designed such that the test time remains constant in all the cases. From the first example for a total capacity of 8K-bits, to the fourth example for a total capacity of 256K-bits, the test time is constant (approximately 7K vectors). These examples cover all kinds of memory design at the chip as well as at the board level.

With a slight modification in the designs as given in the above four examples, memory can be designed for fault diagnosis.

Figure 10:
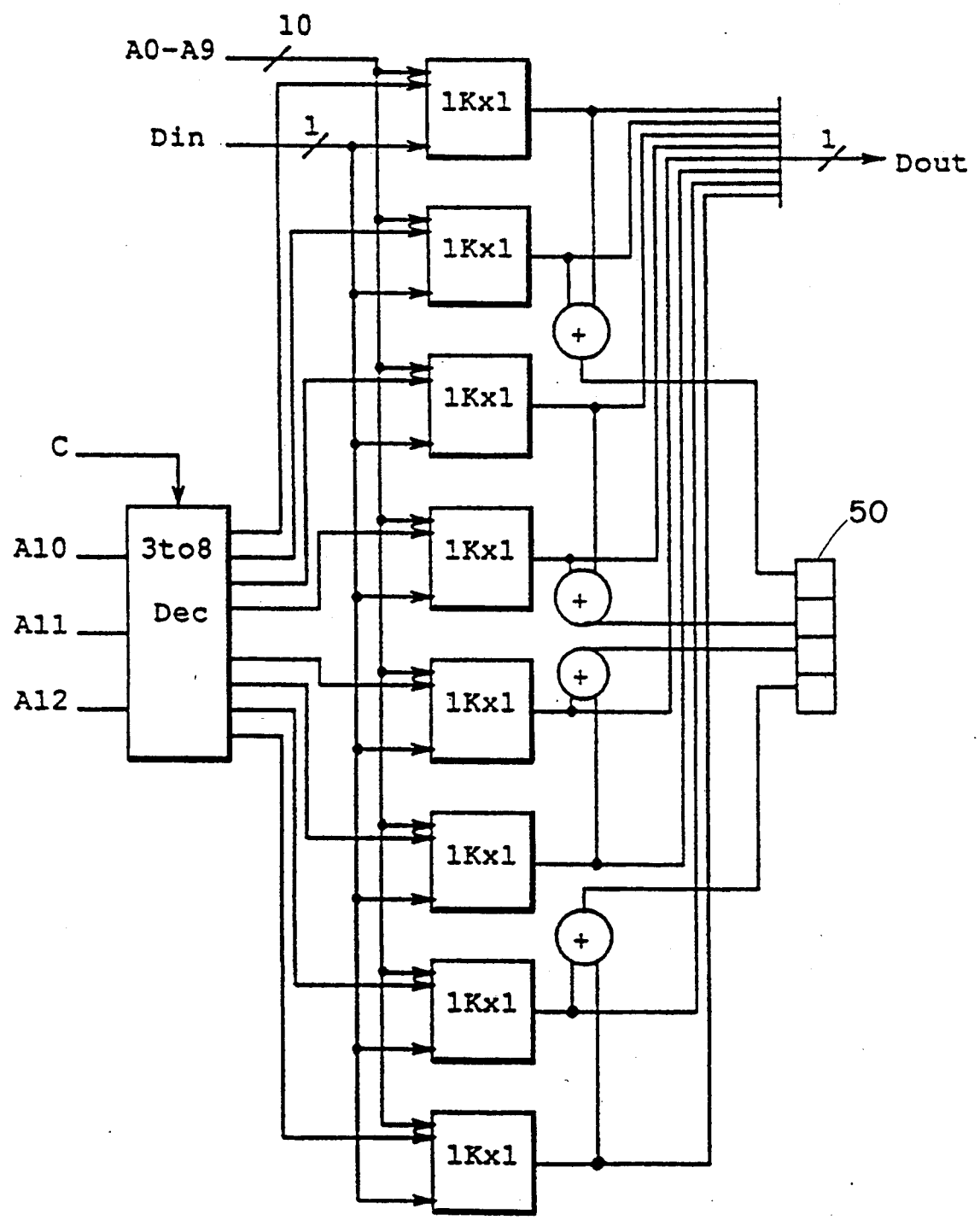
FIG. 10 is a 8K×1 memory design for fault diagnosis and reconfiguration.

The basic idea is to use a register instead of parity circuit to obtain better observability. Consider the design of 8K×1 memory as given in the first embodiment. The modified design is shown in FIG. 10. The design given in FIG. 10 is basically the same as given in FIG. 4, except the OR gate in parity circuit of FIG. 4 has been replaced by a 4-bit register 50. The test method is the same as given previously. However, instead of looking at one bit parity output, the test response of two blocks (each 1K×1) are observable. Thus, a faulty memory block can be uniquely identified in FIG. 10. Observability can be further enhanced if the whole parity circuit is replaced by an 8-bit register (not shown). In this case, a faulty 1K×1 block can be uniquely identified.

In the design of 32K×1 memory, the second example, a four bit register can be used at the output lines of 8K×1 blocks instead of the OR gate. In this case, a faulty 8K×1 block can be identified. If a detailed fault diagnosis is required, four registers can be used within the 8K×1 blocks instead of parity trees. Another possibility is to use a single 32-bit long register in which each bit represents the $D_{out}$ line of 1K×1 memory block. In both cases, a faulty 1K×1 block can be identified. In general, if only fault detection is required, parity trees are recommended since the registers require more area than do the XOR and OR gates.

After locating a faulty block, the STD architecture also allows an easy reconfiguration of the memory into ¾ or ½ of the original capacity. The idea is to permanently connect the corresponding address line of the most significant part of address decoder to ground Gnd or power supply Vdd which each act as a constant reference. For example, a faulty 2K×1 memory (2 blocks each of 1K×1) can be disconnected in FIG. 10 by connecting the corresponding address line (A10-A12) to Gnd/Vdd. It is also possible to Gnd one address line and effectively convert 3-to-8 decoder into 2-to-4 decoder. In this case, memory is reconfigured into ½ of the original capacity.

In comparison to the existing schemes as disclosed, for example by M. F. Chang, W. K. Fuchs and J. I. Patel, "Diagnosis and repair of memory with coupling faults", IEEE Trans. Comp., vol. 38(4), pp. 493–500, April 1989; W. K. Huang, Y. Shen and F. Lombardi, "New approaches for the repairs of memories with redundancy by row/column deletion for yield enhancement", IEEE Trans. CAD, vol. 9(3), pp. 323–328, March 1990; C. L. Wey and F. Lombardi, "On the repair of redundant RAMs", IEEE Trans. CAD, vol. 6(2), pp. 222–231, March 1987; T. Fuja and C. Heegard "Row/column replacement for the control of hard defects in semiconductor RAMs", IEEE Trans. Comp., vol. 35(11), pp. 996–1000, November 1986; reconfiguration in this STD architecture is extremely simple and does not require special hardware such as laser programmable switches.

The main advantage of the present invention is that a very small test time can be achieved for any size of memory. The test time can be kept constant irrespective of the memory size. The design procedure is highly structured and test vectors need not be calculated for different memories having the same size of partitions (except the additional vectors needed to test decoders). The design uses existing memory blocks of small size and hence large memories can be designed by this method in a significantly short design time. The architecture is not limited to the chip design, but is also directly applicable to memory board design without any modification to the memory board.

Further, with a slight modification, fault diagnosis can also be achieved. Fault diagnosis is extremely important from a reliability point of view. By identifying a faulty memory block (memory chip in case of a board), the block can be replaced by an operable block provided memory redundancy is available. When redundancy memory is not available, the faulty block should be disconnected and by modifying the most significant decoder the good memory blocks can still be used. Memory can be configured into ¾ or ½ or ¼ capacity of the original size.

Figure 11:
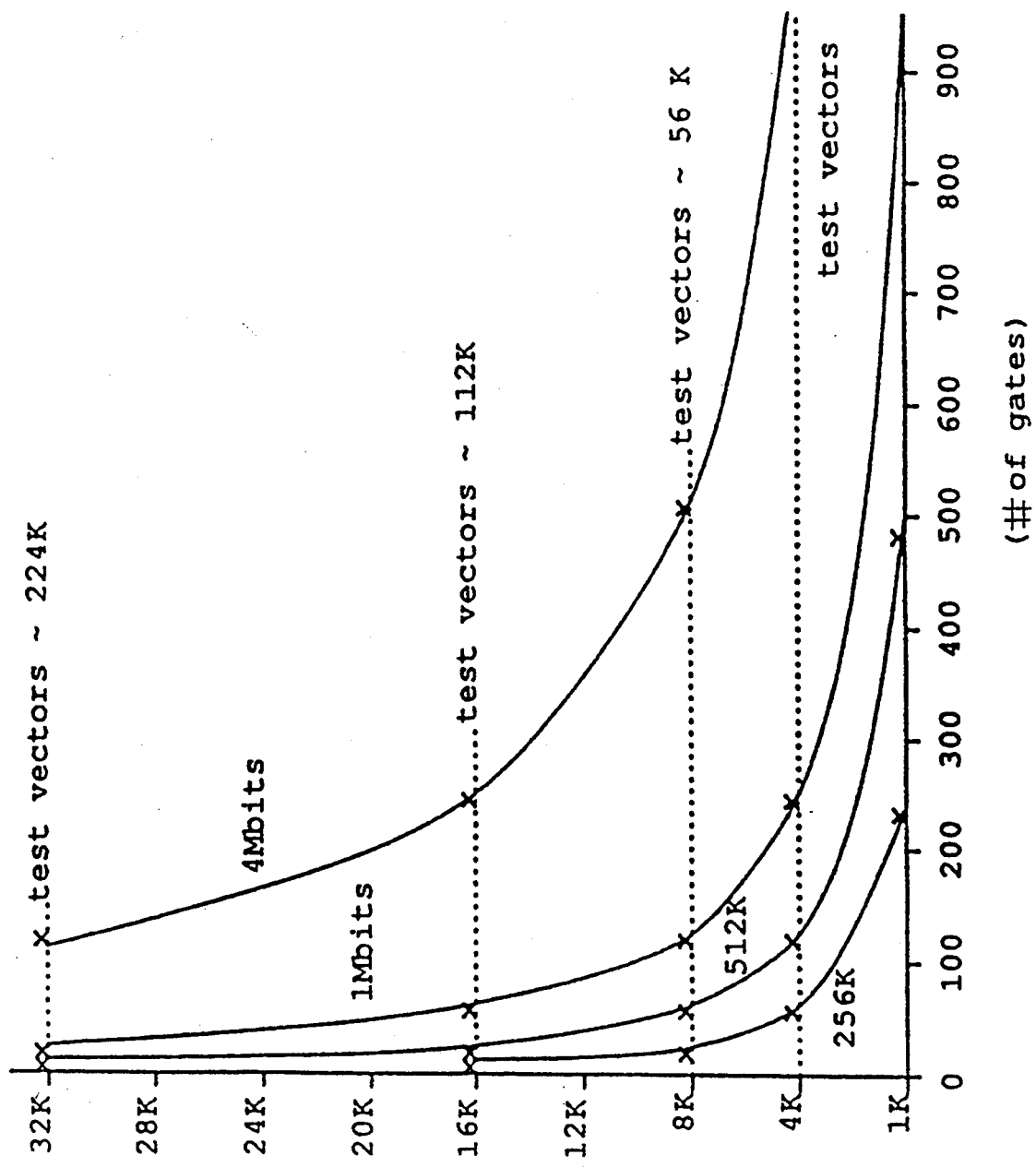
FIG. 11 is a graph showing the trade-off in partition size versus extra hardware with the dotted lines representing a constant test time.

The STD architecture does require some extra hardware to observe the test response. For very large memories, if the test time is kept extremely small (for example, 4M-bit memory is partitioned into 1K-bit blocks), the hardware overhead becomes significant. The hardware overhead is inversely proportional to the partition size. This trade-off for various memories is shown in FIG. 11. It should be noted that in FIG. 11, the overhead is measured in the number of gates. In literature, the term percentage overhead is used in a general sense. However, often this does not provide a real representation. For example, 10% overhead for 16K-bit memory might be acceptable, but for 16M-bit memory it is highly undesirable. The overhead (routing area) for the control signal is negligible in STD architecture as previously explained. If the complex gates are used as shown in FIG. 5b, the area overhead due to additional transistors associated with the control signal inside the decoder is also negligible. The partitioning and implementation of the decoder into two or more levels in fact causes a savings in the transistor count.

This fact can be visualized by consideration of the following example, i.e., 4-to-16 decoder. One level implementation of 4-to-16 decoder using 4-input gates requires 128 transistor (64 nMOS and 64 pMOS transistors). The same decoder can be implemented in two levels using five 2-to-4 decoders. In this case, the total number of transistors is ($5 \times 16 = 80$). It should also be noted that such partitioning of the decoder also results in the decrease in signal propagation delay as discussed in M. Shoji, "CMOS Digital Circuit Technology", Prentice Hall, 1988. Therefore, such partitioning is desirable to improve the performance.

The invention has been described with reference to the preferred embodiment. Obviously, modifications and alterations will occur to others upon reading and understanding the preceding detailed description of the preferred embodiment. It is intended that the invention be construed as including all such modifications and alterations insofar as they come within the scope of the appended claims or the equivalents thereof.

Having thus described the preferred embodiment, the invention is now claimed to be:

1. A random access memory (RAM) comprising:
   a memory array logically partitioned, through memory address lines, into a plurality of individually accessible equivalently sized memory blocks, each memory block having a memory capacity less than a total memory capacity of the RAM;
   a decoding means for accessing the plurality of memory blocks, the decoding means having at least two decoding levels, including one or more decoders at a first lower level for decoding least significant address lines and one decoder at a second higher level for decoding most significant address lines, wherein the higher level decoder provides a select signal to all lower level decoders, selecting during a test mode all lower level decoders;
   an external control signal received by the higher level decoder during a test mode, the control signal causing the higher level decoder to select each of the plurality of lower level decoders to access all memory blocks simultaneously and in parallel;
   a means for testing, simultaneously and in parallel, data in corresponding address locations in each of the plurality of memory blocks in a sequential manner to determine whether any of the plurality of memory blocks contain any of a plurality of predetermined types of faults, wherein said testing means maintains the test time constant irrespective of the total memory capacity and wherein when the memory capacity is increased the number of memory blocks increases, each of the memory blocks being of a constant size irrespective of the total memory capacity; and
   an output means for outputting a signal indicating existence of any of the plurality of faults determined to exist by the testing means.

2. The random access memory (RAM) of claim 1 wherein the output means includes exclusive OR gates and at least one OR gate.

3. The random access memory (RAM) of claim 1 wherein the output means includes a register.

4. The random access memory (RAM) of claim 1 wherein the RAM is of a type used in board level development.

5. The random access memory (RAM) of claim 1 wherein the RAM is of a type used in chip level development.

6. The random access memory (RAM) of claim 1 wherein the testing means performs 7 n read/write operations, wherein (n) is the number of bits being tested.

7. The random access memory (RAM) of claim 1 wherein the memory blocks being tested are of a building block configuration such that larger memories are constructed of wholly incorporated smaller memories.

8. The random access memory (RAM), of claim 1 wherein the plurality of faults being tested, include stuck at 1/0 faults, 1-to-0 and 0-to-1 state transition faults, bridging faults between two memory cells, data retention faults and decoder faults.

9. A method of testing random access memory (RAM) comprising:
   partitioning the RAM during design such that it is separated into a plurality of equivalent memory blocks having a memory capacity less than a total memory capacity of the RAM;
   decoding the RAM with at least two separate levels of decoding means, wherein a first level of decoding means decodes least significant address lines and a second level of decoding means decodes most significant address lines;
   activating a control signal associated with the most significant address lines wherein each of the plurality of memory blocks are selected simultaneously and in parallel;
   inputting selected known vectors, in a parallel manner, to each of the plurality of selected memory blocks;
   producing an output indicating a fault in at least one of the memory blocks;
   the inputting and producing steps including,
      setting a '0' in each of the memory cells;
      inspecting each of the memory cells from a first (1)st cell to a last (n)th cell after each occurrence of setting an individual cell to '0' to determine whether the individual cell is 0 or 1;
      initiating, simultaneously, two loops, the first loop extending from the first (1)st memory cell to a (n/2)th cell and the second loop extending from the last memory cell (n)th to a (n/2+1)th cell;
      performing first loop complementing of the value of each cell from the first memory cell to the (n/2)th memory cell;
      reading each of the memory cells from the first (1)st cell through to the (n/2)th cell after the first loop complementing of the value of each individual cell to determine whether the individual cell has accepted the complementing;
      performing second loop complementing of the value of each cell from the last (n)th cell to the (n/2+1)th memory cell;

reading each of the memory cells from the last (n)th cell through to the (n/2+1)th cell, after second loop complementing of the value of each individual cell to determine whether the individual cell has accepted the complementing;

outputting an indication of faults determined during each repetition of the reading steps;

initiating, simultaneously, another two loops, the another first loop extending from the (n/2)th memory cell to the first memory cell and the another second loop extending from the (n/2+1)th memory cell to the last (n)th memory cell;

performing first loop complementing of the value of each memory cell from the (n/2)th memory cell to the first (1)st memory cell;

reading each of the memory cells from the (n/2)th all through to the first (1)st memory cell after first loop complementing of the value of each individual cell, to determine whether the individual cell has accepted the complementing;

performing second loop complementing of the value of each cell from the (n/2+1)th memory cell to the last (n)th memory cell;

reading each of the memory cells from the (n/2+1)th cell through to the last (n)th memory cell, after second loop complementing of the value of each individual cell, to determine whether the individual cell has accepted the complementing; and outputting an indication of faults determined during each repetition of the reading step.

10. The method of claim 9 further including substituting '1' for each setting of '0' and substituting '0' for each setting of '1'.

11. The method of claim 10 further including the step of reconfiguring the RAM, to exclude particular ones of the partitioned memory blocks diagnosed to be faulty, by setting one of the selected most significant address line to a constant reference.

12. The method of claim 9 further including a step of diagnosing faults occurring in the plurality of memory blocks, wherein such diagnosing is accomplished by outputting the results of the diagnosing step to a register.

13. The method of claim 9 further including the step of generating larger memories by wholly incorporating a plurality of small memories.

14. A method of testing random access memory (RAM) comprising:

logically partitioning the RAM, through memory address lines, into a plurality of individually accessible equivalently sized memory blocks, each memory block having a memory capacity less than a total memory capacity of the RAM;

decoding the plurality of memory blocks, the decoding having at least two levels, a first lower level including one or more decoders for decoding least significant address lines and a second higher level including one decoder for decoding most significant address lines, wherein the higher level decoder provides a select signal to all lower level decoders, selecting during a test mode all lower level decoders;

sending an external control signal to the higher level decoder during a test mode, causing the higher level decoder to select each of the plurality of memory blocks simultaneously and in parallel;

testing, simultaneously and in parallel, the plurality of memory blocks to determine whether any of the plurality of memory blocks contain any of a plurality of predetermined types of faults, wherein said testing maintains the test time constant irrespective of memory size and wherein an increase in the memory capacity results in an increase in the number of memory blocks, each of the memory blocks being of a constant size irrespective of the total memory capacity; and outputting a signal indicating an existence of any of the plurality of faults determined to exist in the testing step.

15. The random access memory, (RAM), of claim 14 wherein the plurality of faults being tested, include stuck at 1/0 faults, 1-to-0 and 0-to-1 state transition faults, bridging faults between two memory cells, data retention faults and decoder faults.

* * * * *